United States Patent
Takeuchi

(10) Patent No.: US 8,690,371 B2
(45) Date of Patent: Apr. 8, 2014

(54) BOARD HOLDER, ELECTRONIC DEVICE, AND DISPLAY APPARATUS

(75) Inventor: Hideto Takeuchi, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 122 days.

(21) Appl. No.: 13/266,494

(22) PCT Filed: Apr. 27, 2010

(86) PCT No.: PCT/JP2010/057433
§ 371 (c)(1),
(2), (4) Date: Oct. 27, 2011

(87) PCT Pub. No.: WO2010/126031
PCT Pub. Date: Nov. 4, 2010

(65) Prior Publication Data
US 2012/0044668 A1    Feb. 23, 2012

(30) Foreign Application Priority Data

Apr. 28, 2009  (JP) ................................. 2009-109941
Apr. 26, 2010  (JP) ................................. 2010-101016

(51) Int. Cl.
G09F 13/04    (2006.01)

(52) U.S. Cl.
USPC ........................................ 362/97.1; 362/97.3

(58) Field of Classification Search
USPC .............................................. 362/97.3, 97.1
See application file for complete search history.

(56) References Cited

U.S. PATENT DOCUMENTS

| 7,841,740 | B2* | 11/2010 | Zhou et al. ............... | 362/249.02 |
| 2005/0073858 | A1* | 4/2005 | Kim et al. ..................... | 362/561 |
| 2006/0187660 | A1* | 8/2006 | Liu ................................ | 362/294 |
| 2006/0279671 | A1 | 12/2006 | Han et al. | |
| 2007/0007539 | A1 | 1/2007 | Kim et al. | |
| 2007/0121318 | A1 | 5/2007 | Nanbu | |

FOREIGN PATENT DOCUMENTS

| CN | 1892364 A | 1/2007 |
| CN | 101349405 A | 1/2009 |
| JP | 58-155681 A | 9/1983 |
| JP | 2006-338020 A | 12/2006 |
| JP | 2007-109404 A | 4/2007 |
| JP | 2007-149540 A | 6/2007 |
| JP | 2007-157657 A | 6/2007 |
| JP | 2007-287826 A | 11/2007 |
| JP | 2007-311517 A | 11/2007 |
| JP | 2008-41546 A | 2/2008 |
| JP | 2009-87772 A | 4/2009 |

* cited by examiner

*Primary Examiner* — Evan Dzierzynski
(74) *Attorney, Agent, or Firm* — Birch, Stewart, Kolasch & Birch, LLP

(57) ABSTRACT

A hole that penetrates each light emitting diode board in the thickness direction of the board is provided, on one end portion in the longitudinal direction of each of a plurality of light emitting diode boards which have a plurality of light emitting diodes mounted on one surface, respectively have substantially a strip shape, and are arranged in a plurality of rows. The board holder has: protruding sections which are inserted into the holes of the adjacent light emitting diode boards; and a coupling section which is disposed in the direction orthogonally intersecting the longitudinal direction of the light emitting diode board, has a strip-shape, and couples respective base ends of the protruding sections. The plurality of light emitting diode boards disposed in parallel are held by inserting the protruding sections into the holes.

13 Claims, 18 Drawing Sheets

F I G. 13
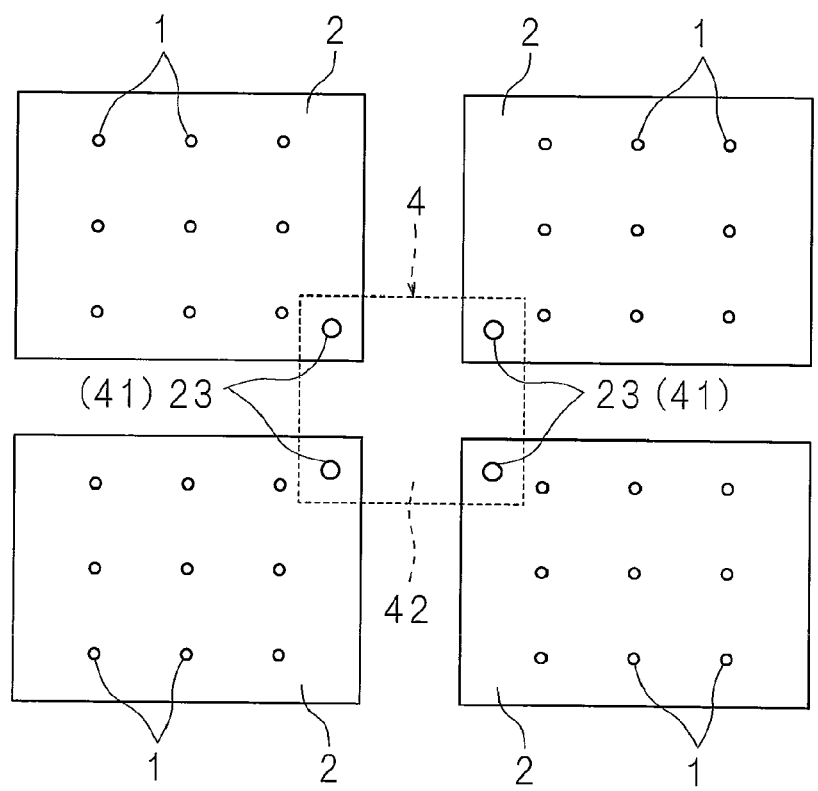

BOARD HOLDER, ELECTRONIC DEVICE, AND DISPLAY APPARATUS

This application is the national phase under 35 U.S.C. §371 of PCT International Application No. PCT/JP2010/057433 which has an International filing date of Apr. 27, 2010 and designated the United States of America.

BACKGROUND

1. Technical Field

The present invention relates to a board holder that holds a plurality of circuit boards disposed in parallel, an electronic device having the board holder, and a display apparatus having the electronic device.

2. Description of Related Art

In a display apparatus such as a television, on the back side of a display section having a display screen displaying an image on the front side, an electronic device is disposed that has a light source for irradiating the display section.

The electronic device is provided with, for example, a plurality of light emitting diode boards disposed in parallel and having a plurality of light emitting diodes mounted on one surface, a plurality of lenses that diverge the light emitted by the light emitting diodes, a lens cover that has through holes in which the lenses are disposed and sandwiches peripheral parts of the lenses with the light emitting diode boards, and a backlight frame that supports the light emitting diode boards disposed in parallel (see, for example, Japanese Patent Application Laid-Open No. 2008-41546).

A plurality of insertion holes are formed in the light emitting diode boards and the lens cover, attachment holes corresponding to the insertion holes are formed in the backlight frame, and male screws inserted in the insertion holes of the light emitting diode boards and the lens cover are screwed into the attachment holes, whereby the light emitting diode boards and the lens cover are fixed to the backlight frame and the peripheral parts of the lenses are sandwiched between peripheral parts of the through holes in the lens cover and the light emitting diode boards to thereby fix the lenses.

SUMMARY

However, in the electronic device structured so that a plurality of light emitting diode boards disposed in parallel are individually fixed by male screws as in Japanese Patent Application Laid-Open No. 2008-41546, there is a problem in that the number of man-hours for screwing the male screws increases, the workability of attachment of the light emitting diode boards is poor and this results in high cost.

The present invention has been made with the aim of solving the above problems, and it is an object of the present invention to provide: a board holder capable of easily holding a plurality of circuit boards disposed in parallel, on a support member, without using a screw; an electronic device having the board holder; and a display apparatus having the electronic device.

A board holder according to the present invention is a board holder that holds, on a support member for supporting a plurality of circuit boards disposed in parallel, the circuit boards, and is characterized by comprising: a plurality of protruding sections to be inserted in holes formed in an adjacent circuit boards and the support member; and a coupling section coupling the protruding sections.

In this invention, by inserting the protruding sections of the board holder from the holes of the adjacent circuit boards into the holes of the support member in a condition where a plurality of circuit boards having the holes corresponding to the holes of the support member are disposed in parallel on the support member having the holes, the adjacent circuit boards can be simultaneously held on the support member, the separation distances between the circuit boards can be made uniform, and the circuit boards can be secured in this condition, so that the workability of attachment of the circuit boards disposed in parallel onto the support member can be improved.

Moreover, preferably, the protruding sections of the board holder according to the present invention are arranged in a plurality of rows.

In this invention, when a plurality of circuit boards having the holes are arranged in a plurality of rows, by inserting the protruding sections of one board holder into the holes of a plurality of circuit boards, the circuit boards in a plurality of rows can be simultaneously held on the support member, the separation distances between the circuit boards in a plurality of rows can be made uniform, and the circuit boards can be secured in this condition, so that the workability of attachment of the circuit boards disposed in parallel onto the support member can be improved.

Moreover, preferably, the coupling section of the board holder according to the present invention has an attachment section attached to the support member.

In this invention, when the protruding sections of one board holder are inserted in the holes of a plurality of circuit boards, the attachment section of the board holder can be attached to the support member, so that the circuit boards can be firmly secured without any increase in the number of parts.

Moreover, preferably, the coupling section of the board holder according to the present invention has a columnar section having an end contacting with a sheet surface of an optical sheet disposed facing to the circuit boards with a space therebetween, thereby limiting a bend of the optical sheet.

In this invention, a bend, toward the circuit board side, of the optical sheet disposed facing to the circuit boards with a space therebetween can be restrained by the columnar section without any increase in the number of parts, so that the optical characteristic by the optical sheet can be stabilized.

Moreover, preferably, the board holder according to the present invention has a connector between the protruding sections of the coupling section.

In this invention, when the protruding sections of the board holder are inserted in the holes of the adjacent circuit boards to thereby hold the circuit boards on the support member, the connector of the coupling section can be connected to the connecting sections of the adjacent circuit boards, in other words, the board holder itself constitutes the connector, so that the workability of connection of the circuit boards by the connector can be improved. Moreover, the connector can be covered with the coupling section, so that the brightness characteristic can be improved.

Moreover, an electronic device according to the present invention is characterized by comprising: a plurality of circuit boards disposed in parallel and having a light emitting diode mounted thereon; and the above-described board holder.

In this invention, by inserting the protruding sections of the board holder into the holes of the adjacent circuit boards in a condition where a plurality of circuit boards having the holes are disposed in parallel, the adjacent circuit boards can be held on the support member, the separation distances between the circuit boards can be made uniform, and the circuit boards can be secured to the support member in this condition, so that the workability of attachment of the circuit boards disposed in parallel can be improved.

Moreover, preferably, in the electronic device according to the present invention, the circuit boards are arranged in a plurality of rows.

In this invention, by inserting the protruding sections of one board holder into the holes of a plurality of circuit boards, the circuit boards in a plurality of rows can be held on the support member, the separation distances between the circuit boards in a plurality of rows can be made uniform, and the circuit boards can be attached to the support member in this condition, so that the workability of attachment of the circuit boards disposed in parallel can be improved.

Moreover, preferably, in the electronic device according to the present invention, on one surface of each of the circuit boards, a circuit section and the light emitting diode are disposed, and a connecting section for connecting the adjacent circuit boards together by the connector is provided on the one surface.

In this invention, the circuit boards each having the circuit section on one surface can be disposed in parallel in such a way that the other surfaces are two-dimensionally aligned, so that the thickness of the circuit board portion can be reduced and the electronic device can be reduced in thickness. Moreover, the other surfaces of the circuit boards disposed in parallel can be brought close to the support member supporting the circuit boards without affected by the connectors, so that it is unnecessary to form through holes corresponding to the connectors in the support member and the dust-proofness of the circuit board portion can be improved.

Moreover, preferably, in the electronic device according to the present invention, the connector is provided on the coupling section.

In this invention, the board holder itself constitutes the connector, so that it is not particularly necessary to operate the connector and the workability of connection of the circuit boards by the connector can be improved. Moreover, the connector can be covered with the coupling section, so that the brightness characteristic can be improved.

Moreover, preferably, in the electronic device according to the present invention, a support member that supports the circuit boards is provided, and the support member and the circuit boards are provided with holes in which the protruding sections are inserted.

In this invention, when the protruding sections of one board holder are inserted in the holes of a plurality of circuit boards, the attachment sections of the board holder can be attached to the support member, so that the circuit boards can be firmly secured without any increase in the number of parts.

Moreover, preferably, the electronic device according to the present invention is provided with a reflecting sheet that has a through hole in which the light emitting diode is disposed and second holes in which the protruding sections are inserted, and faces the circuit boards to reflect light emitted by the light emitting diode.

In this invention, by inserting the protruding sections of the board holder from the second holes of the reflecting sheet into the holes of the circuit boards, a plurality of circuit boards disposed in parallel and the reflecting sheet can be held on the support member, and the light emitting diodes can be disposed in the through holes of the reflecting sheet, so that the workability of assembly of the reflecting sheet can be improved. Moreover, it is not particularly necessary to provide a reflecting sheet holding member, so that the number of parts can be reduced and cost can be reduced.

Moreover, preferably, in the electronic device according to the present invention, adjacent rows of the circuit boards are separated by different distances.

In this invention, the distances between the rows of the circuit boards can be varied in accordance with the number of light emitting diode boards disposed in parallel, so that the brightness characteristic can be set to an optimum one in accordance with the size of the display screen of the display apparatus in which the electronic device is incorporated.

Moreover, preferably, in the electronic device according to the present invention, the numbers of light emitting diodes mounted on the circuit boards disposed in parallel are different.

In this invention, the lengths of a plurality of circuit boards disposed in parallel in the row direction can be varied, so that the light emitting diode boards having different numbers of light emitting diodes can be combined in accordance with the size of the display section of the display apparatus in which the electronic device is incorporated, the basic shapes of the light emitting diode boards and the board holder can be made the same, the assembly workability, and the productivity of parts such as the board holder can be improved, and cost can be further reduced.

Moreover, a display apparatus according to the present invention is characterized by comprising a display section having a display screen on one side and the above-described electronic device disposed on the other side of the display section.

In this invention, by inserting the protruding sections of one board holder into the holes of the circuit boards in a plurality of rows, the circuit boards in a plurality of rows can be simultaneously held on the support member, the separation distances between the circuit boards in a plurality of rows can be made uniform, and the circuit boards can be secured to the support member in this condition, so that the workability of attachment of the circuit boards disposed in parallel can be improved.

According to the present invention, by inserting the protruding sections of the board holder into the holes of the adjacent circuit boards and the holes of the support member in a condition where a plurality of circuit boards having the holes are disposed in parallel, the adjacent circuit boards can be simultaneously held on the support member, and the separation distances between the circuit boards can be made uniform, so that the workability of attachment of the circuit boards disposed in parallel onto the support member can be improved and cost can be reduced.

The above and further objects and features will more fully be apparent from the following detailed description with accompanying drawings.

BRIEF DESCRIPTION OF THE SEVERAL VIEWS OF THE DRAWINGS

FIG. 13 is a schematic view showing another relationship between the light emitting diode boards and the board holder of the electronic device according to the present invention;

DETAILED DESCRIPTION

The following will describe in detail the present invention with reference to the drawings illustrating some embodiments thereof.

First Embodiment

Figure 1:
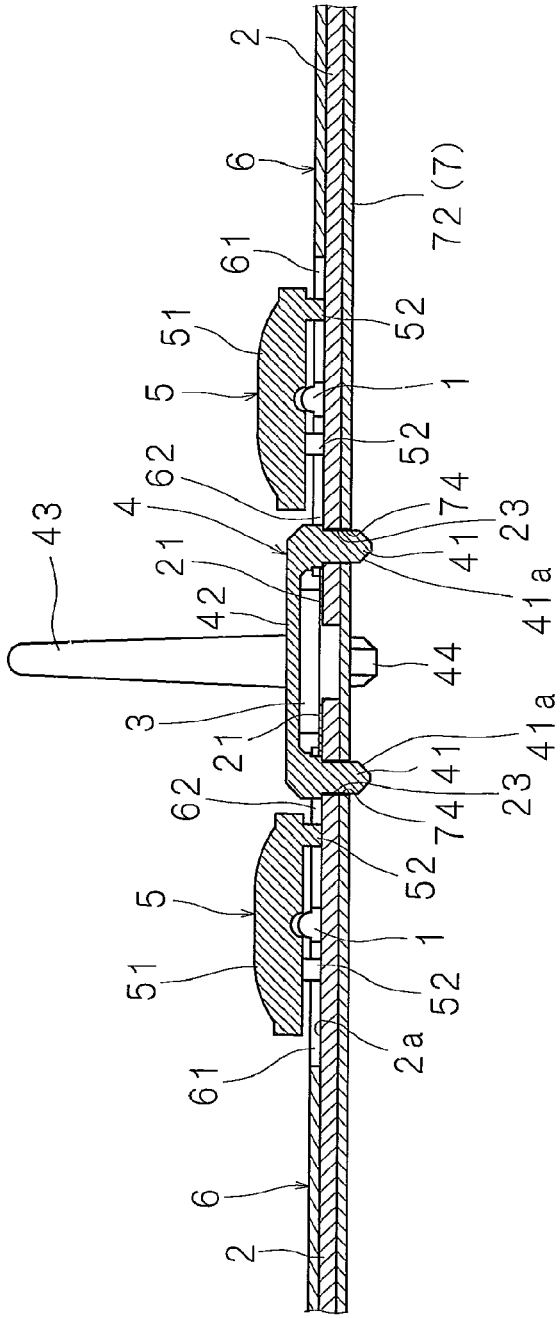
FIG. 1 is an enlarged cross-sectional view showing a part of the structure of an electronic device according to the present invention.
Figure 2:
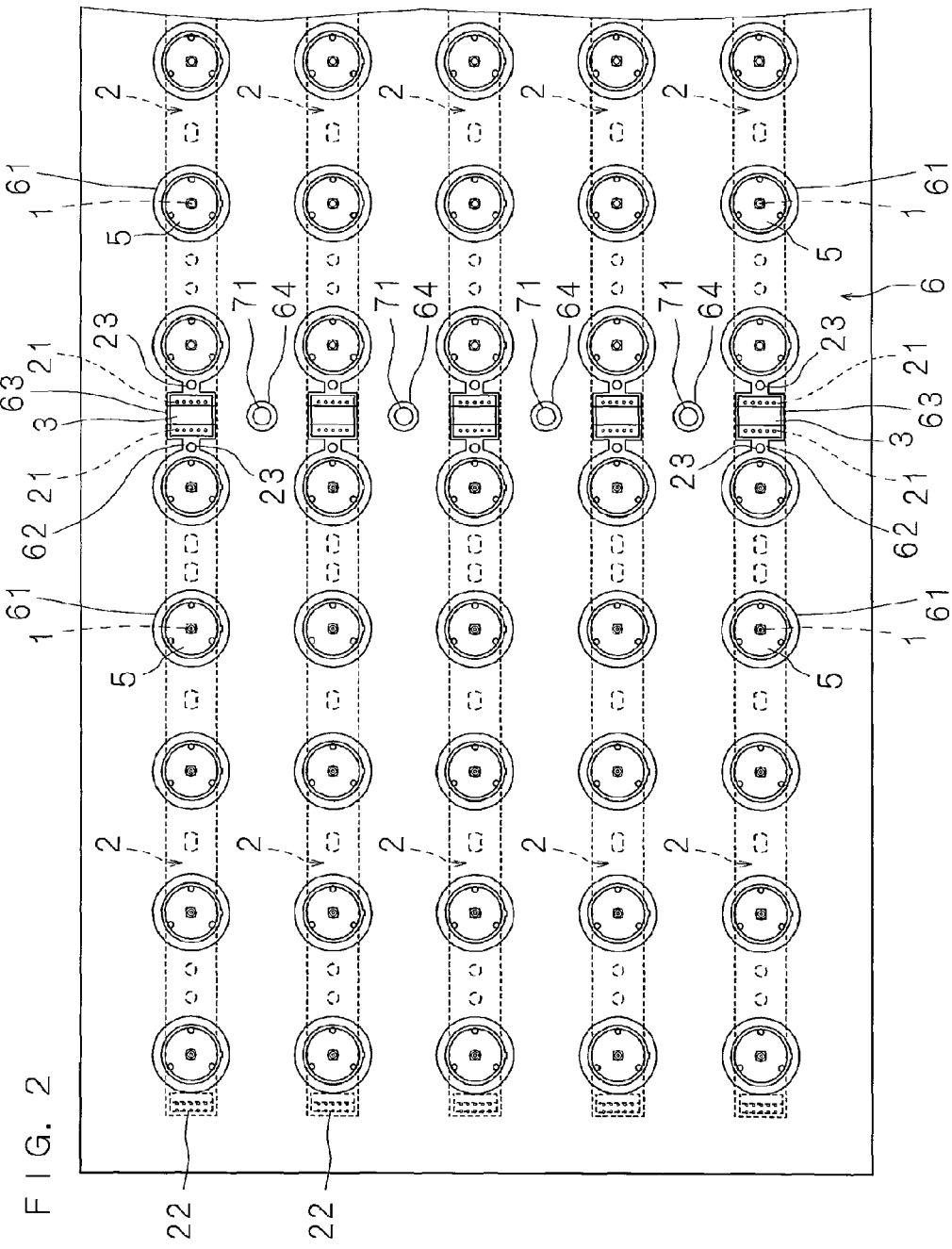
FIG. 2 is a partly omitted plan view of the electronic device according to the present invention.
Figure 3:
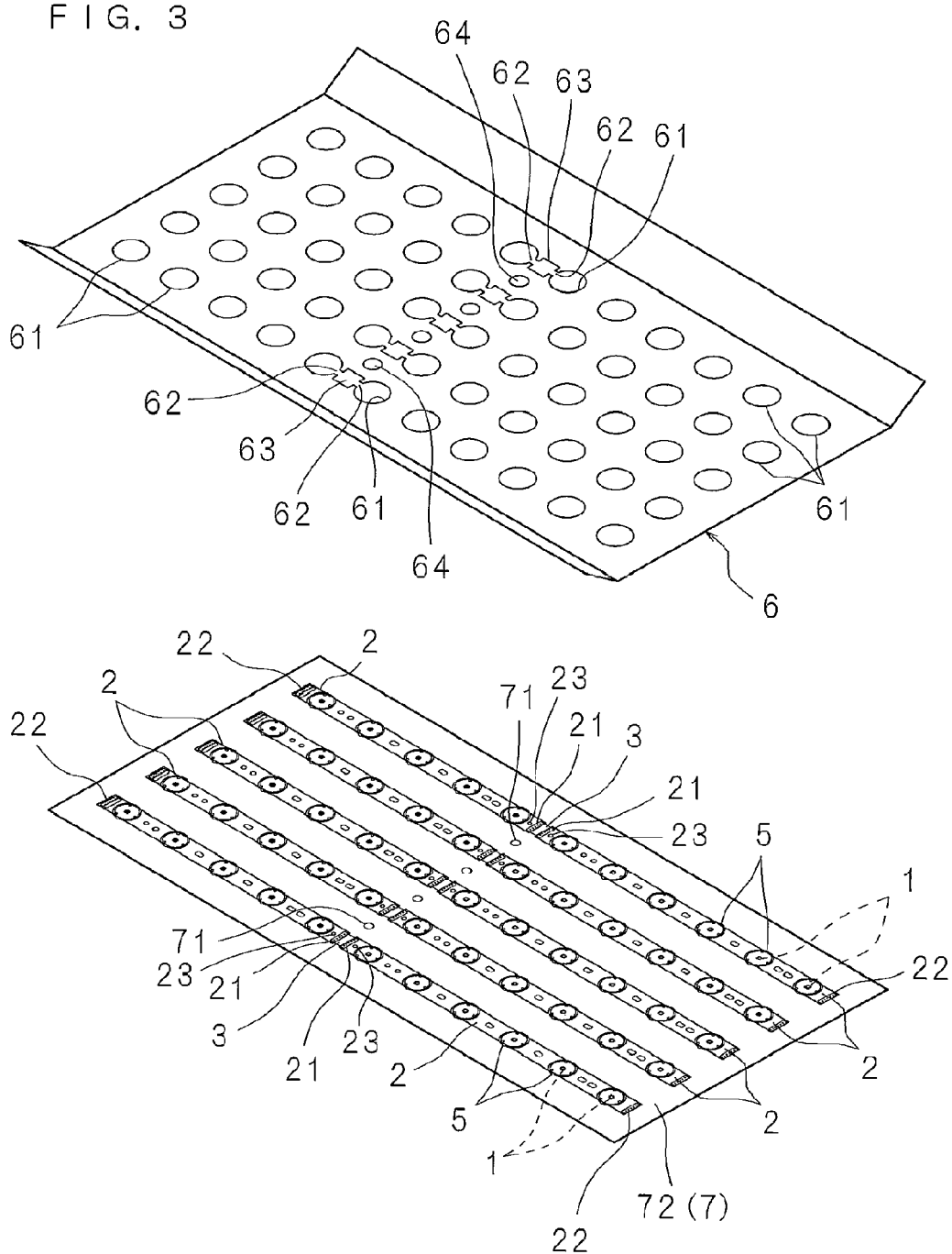
FIG. 3 is a partly exploded schematic perspective view of the electronic device according to the present invention.
Figure 4:
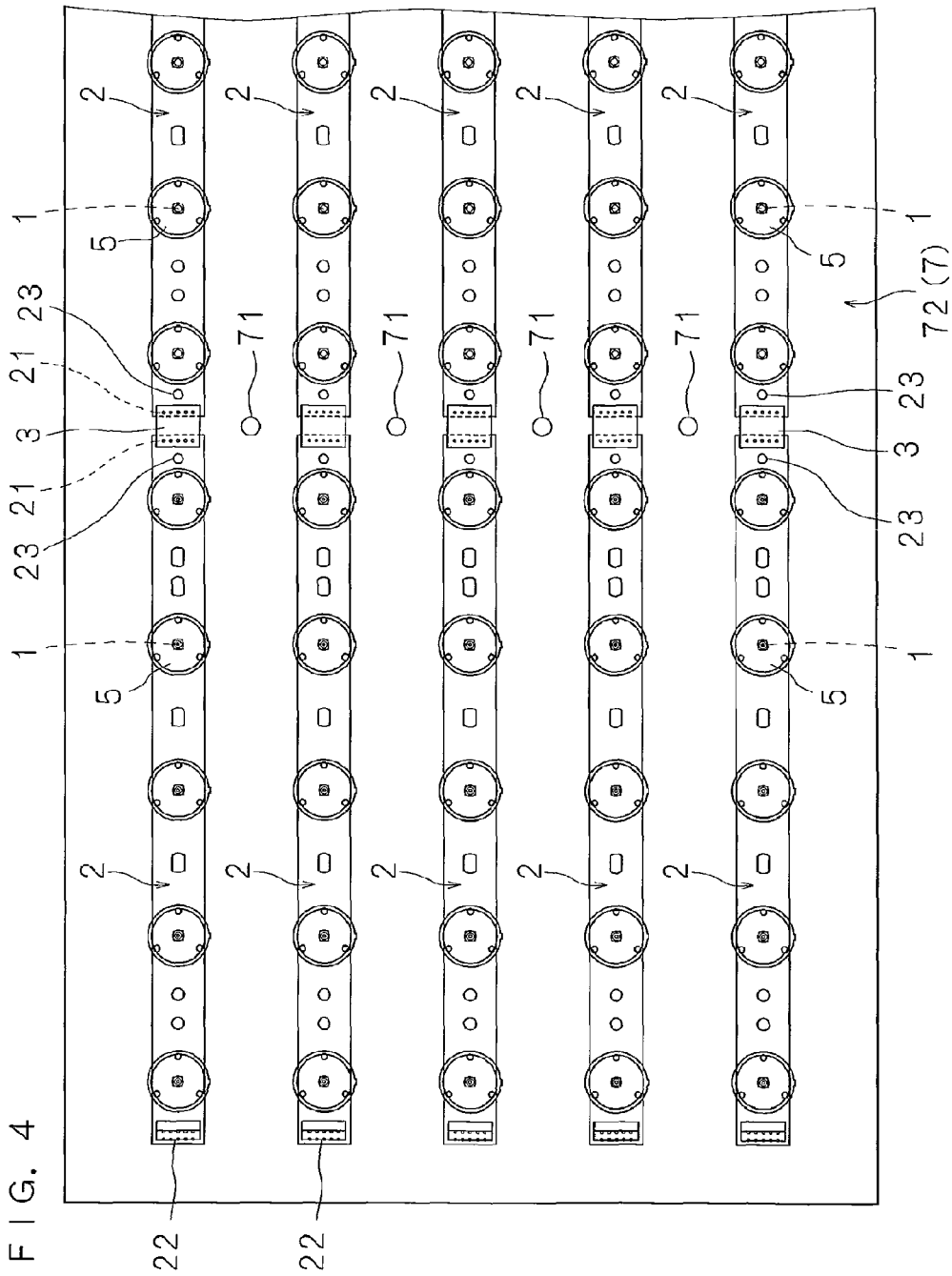
FIG. 4 is a plan view showing a condition where a reflecting sheet of the electronic device according to the present invention is eliminated.
Figure 5:
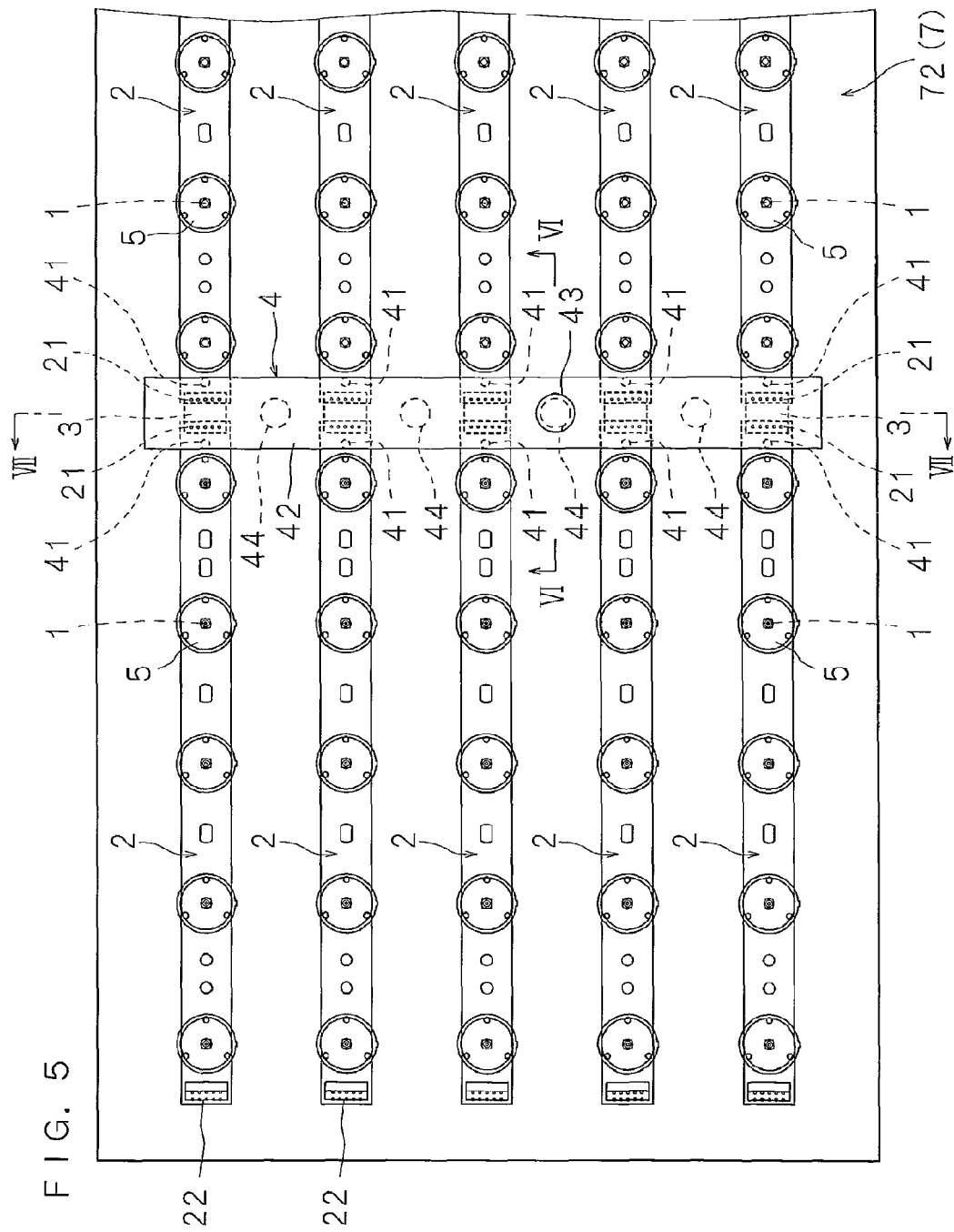
FIG. 5 is a plan view showing a condition where the reflecting sheet of the electronic device according to the present invention is absent and a board holder is attached.
Figure 6:
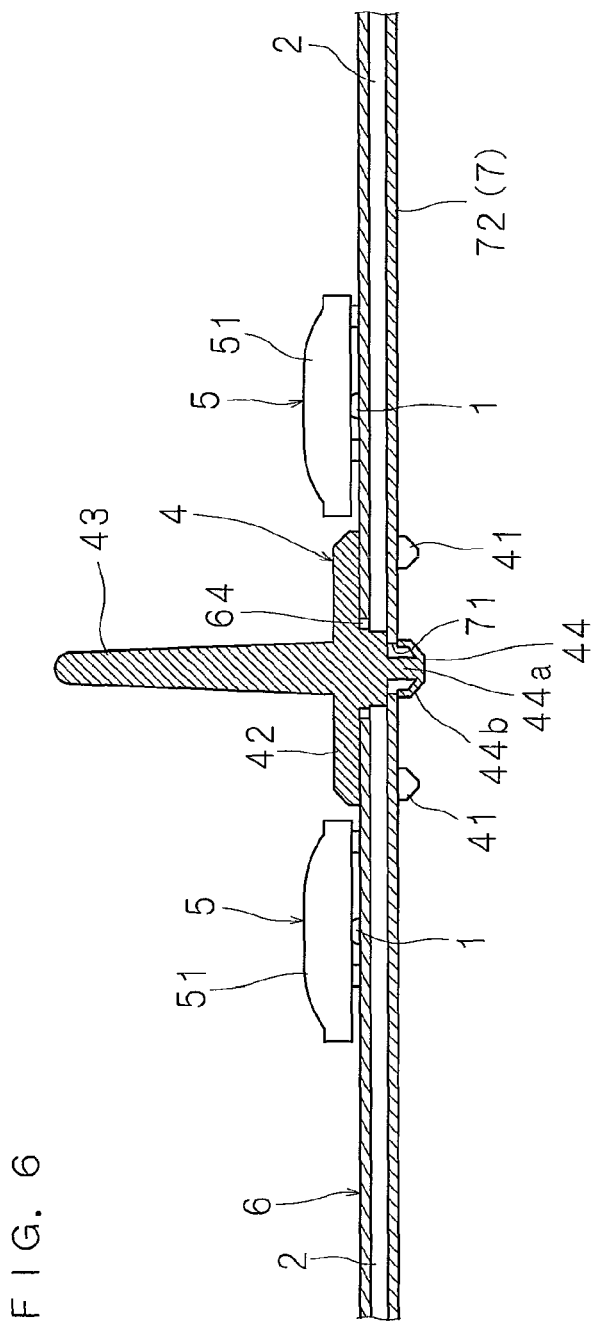
FIG. 6 is an enlarged cross-sectional view taken along the line VI-VI of FIG. 5 in a condition where the reflecting sheet is present.
Figure 7:
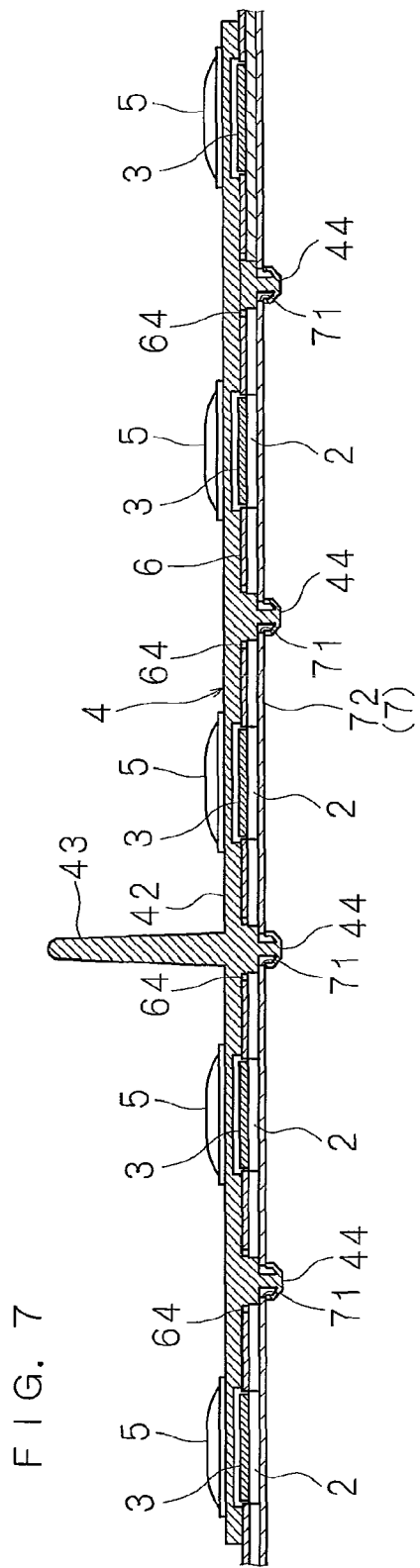
FIG. 7 is an enlarged cross-sectional view taken along the line VII-VII of FIG. 5 in a condition where the reflecting sheet is present.
Figure 8:
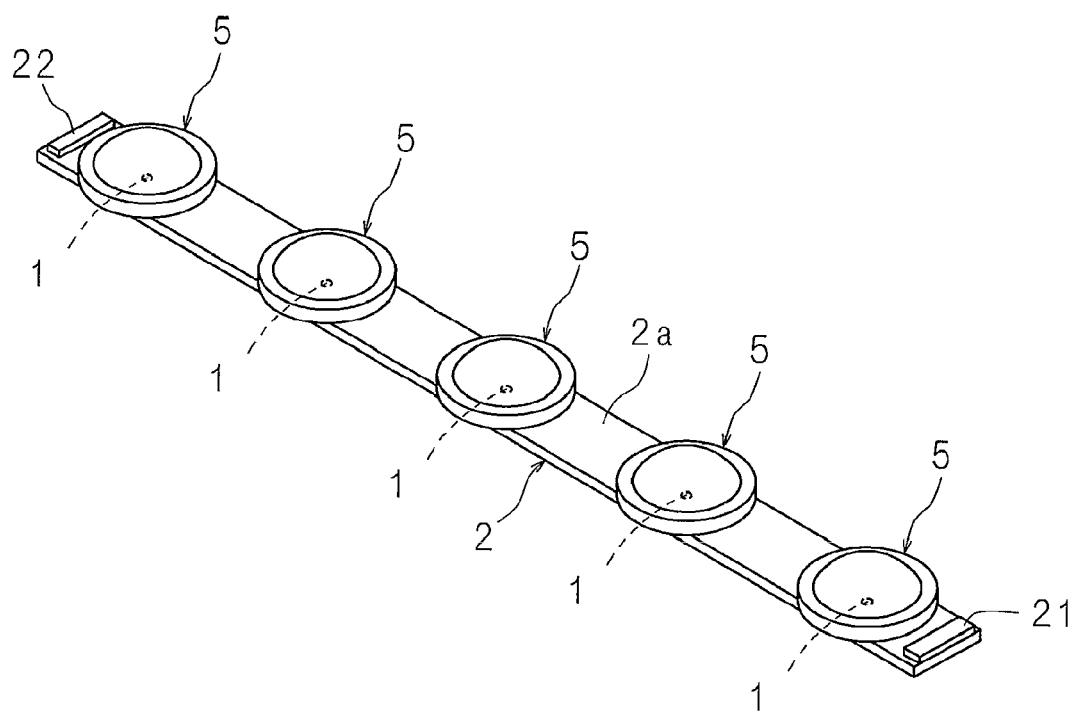
FIG. 8 is a perspective view showing the structure of a light emitting diode board to which lenses are attached in the electronic device according to the present invention.

FIG. 1 is an enlarged cross-sectional view showing a part of the structure of an electronic device according to the present invention. FIG. 2 is a partly omitted plan view of the electronic device. FIG. 3 is a partly exploded schematic perspective view of the electronic device. FIG. 4 is a plan view showing a condition where a reflecting sheet is eliminated. FIG. 5 is a plan view showing a condition where the reflecting sheet is absent and a board holder is attached. FIG. 6 is an enlarged cross-sectional view taken along the line VI-VI of FIG. 5 in a condition where the reflecting sheet is present. FIG. 7 is an enlarged cross-sectional view taken along the line VII-VII of FIG. 5 in a condition where the reflecting sheet is present. FIG. 8 is a perspective view showing the structure of a light emitting diode board to which lenses are attached.

The shown electronic device is attached to the back side of a display section of a flat display apparatus having the display section that has a display screen on the front side and has a substantially rectangular parallelepiped shape. The electronic device has: a plurality of light emitting diodes 1 as light sources disposed in parallel in a grid pattern; a plurality of light emitting diode boards 2 disposed in parallel in a lattice pattern and having the light emitting diodes 1 mounted on one surfaces 2a; a plurality of connectors 3 connecting the adjacent light emitting diode boards 2, 2; a board holder 4 that holds the light emitting diode boards 2; a plurality of lenses 5 attached to the one surfaces 2a of the light emitting diode boards 2 so as to face the top portions of the light emitting diodes 1 and diverging the light emitted by the light emitting diodes 1; a reflecting sheet 6 having through holes 61 in which the lenses 5 are disposed and facing the one surfaces 2a to reflect the light diverged by the lenses 5; and a support member 7 that supports the light emitting diode boards 2 arranged in a plurality of rows.

The light emitting diode boards 2 each have a strip shape having a circuit section on the one surface 2a, and are disposed in parallel in a plurality of rows so as to be separated from each other in the longitudinal direction and in the width direction on one surface 7a of the support member 7 having a substantially rectangular shape. On the one surface 2a of each of the light emitting diode boards 2, as shown in FIG. 8, a plurality of light emitting diodes 1 are mounted so as to be separated in the longitudinal direction. On both end portions in the longitudinal direction of the one surface 2a, connecting sections 21, 22 each having a terminal are provided. In a position biased toward the other end side from the connecting section 21 on one end portion in the longitudinal direction, a hole 23 penetrating in the thickness direction is provided.

In the light emitting diode boards 2 disposed in parallel in a plurality of rows in such a way that one end portions in the longitudinal direction face each other, the two adjacent connecting sections 21, 21 of the light emitting diode boards 2 in each row are connected together by the connector 3, the connecting section 22 of one light emitting diode board 2 is connected to a later-described power supply circuit board by a second connector, and the connecting section 22 of the other light emitting diode board 2 is connected to a later-described control circuit board by a third connector.

The connector 3 has a substantially rectangular parallelepiped shape. On both end portions in the longitudinal direction of one surface of the connector 3, terminals corresponding to the connecting sections 21, 21 are provided, and when terminals are connected to the connecting portions 21, 21, the connector 3 polymerize on the one surfaces 2a of the light emitting diode boards 2.

The board holder 4 has: a plurality of protruding sections 41, 41 to be inserted in the holes 23, 23 formed in one end portions of the light emitting diode boards 2 in each row in the light emitting diode boards 2 disposed in parallel in a plurality of rows in such a way that one end portions in the longitudinal direction face each other; a strip-shaped coupling section 42 that couples base ends of the protruding sections 41, 41; a columnar section 43 protruding from the coupling section 42 in a direction opposite to the protruding sections 41, 41 and an end of which is in contact with a sheet surface of a later-described optical sheet to thereby limit a bend of the optical sheet; and an attachment sections 44 protruding from the coupling section 42 in the same direction as the protruding sections 41, 41 and inserted to be latched in attachment holes 71 formed in the support member 7. The board holder 4 is structured so that the protruding sections 41, 41 are inserted in the holes 23 to thereby hold the light emitting diode boards 2 in relative positions.

As for the protruding sections 41, 41, two that are separated in the longitudinal direction of the light emitting diode boards 2 and the peripheral surfaces of which face each other are disposed in parallel in a plurality of rows in accordance with the separation distance in the row direction of the light emitting diode boards 2. The protruding sections 41, 41 are formed, integrally with the coupling section 42, of polycarbonate that is excellent in light reflectivity. On the end portions of the protruding sections 41, 41, substantially conical insertion sections 41a are provided.

The coupling section 42 is structured so as to face the other surfaces of a plurality of connectors 3 connecting the adjacent light emitting diode boards 2 in a plurality of rows.

The columnar section 43 has a substantially conical shape, and is formed integrally with the coupling section 42.

The attachment sections 44 each have: a plate-like protrusion 44a protruding in the same direction as the protruding sections 41 from between the protruding sections 41 separated in the longitudinal direction of the coupling section 42; and two claws 44b strung out at the end of the plate-like protrusion 44a and latched to the hole edge portion of the attachment hole 71.

The light emitting diodes 1 are mounted, as shown in FIG. 8, for example, five or six in number in such a way as to be separated in the longitudinal direction of the light emitting diode board 2, and in accordance with the light emitting diodes 1, five or six lenses 5 are attached to the one surface 2a by an adhesive agent.

The lens 5 has: a light permeable section 51 that faces the top portion of the light emitting diode 1 so as to be separated therefrom, and has a hemispherical concave portion for diverging in every direction the light emitted by the light emitting diode 1; and three positioning protrusions 52 that protrude from the surface of the light permeable section 51 facing the one surface 2a toward the light emitting diode board 2 and position the light permeable section 51 with respect to the light emitting diode board 2. The ends of the positioning protrusions 52 are attached to the one surface 2a by an adhesive agent.

The positioning protrusions 52 are formed such that the distance between the light permeable section 51 and the light emitting diode boards 2 is slightly longer than the thickness of the reflecting sheet 6 so that the thermal expansion of the reflecting sheet 6 can be absorbed.

The reflecting sheet 6 is formed of one synthetic resin sheet having high reflectivity and being substantially rectangular in accordance with the support member 7, has second holes 62 formed in positions corresponding to the holes 23 of the light emitting diode boards 2, has through holes 61 formed in positions corresponding to the lenses 5, has second through holes 63 formed in positions corresponding to the connectors 3, and has insertion holes 64 formed in positions corresponding to the attachment sections 44.

The through holes 61 have a round shape having a slightly larger diameter than the light permeable sections 51, and are arranged in a grid pattern. The light permeable sections 51 are disposed thereinside. The second through holes 63 are substantially rectangular, and the connectors 3 are inserted therein. The insertion holes 64 have a round shape formed between the second through holes 63, and the attachment sections 44 are inserted therein.

The support member 7 is formed by shaping a metal plate, and has a plate section 72 having a substantially rectangular flat plate form and a frame section 73 ranging along the edge of the plate section 72. In the plate section 72, holes 74 in which the protruding sections 41, 41 of the board holder 4 are inserted and a plurality of attachment holes 71 for attaching the board holder 4 inside the support member 7 are formed. On the one surface 7a of the plate section 72, the light emitting diode boards 2 are accommodated and supported in such a way as to be arranged in the longitudinal direction and in the width direction.

To one side portion in the longitudinal direction of the other surface of the plate section 72, a power supply circuit board is attached that is connected to drivers of the light emitting diode boards 2 by the second connectors and supplies a voltage to the drivers, and to the other side portion in the longitudinal direction, a control circuit board is attached that is connected to the drivers of the light emitting diode boards 2 by the third connectors and controls the drivers. To a central portion in the longitudinal direction of the other surface of the plate section 72, a plurality of circuit boards are attached such as a power supply circuit board that supplies a voltage to the display section, a terminal circuit board that processes the image to be displayed on the display screen of the display section and a control circuit board that controls the display section.

In the electronic device structured as described above, the support member 7 is placed on a workbench so that its opened side faces upward; on the one surface 7a of the plate section 72 of the support member 7, the two light emitting diode boards 2, 2 adjacent to each other in the row direction are disposed in parallel in a plurality of rows; to the connecting sections 21, 21 provided on adjacent one end portions of the light emitting diode boards 2, 2 in each row, the connectors 3 are connected; and on one surfaces of the light emitting diode boards 2 in each row, the reflecting sheet 6 is placed so as to face them.

In this case, the light permeable sections 51 of the lenses 5 are inserted in the through holes 61 of the reflecting sheet 6, and the connectors 3 are inserted in the second through holes 63.

After the reflecting sheet 6 is incorporated, the protruding sections 41, 41 of the board holder 4 are inserted into the holes 23 of the light emitting diode boards 2 from the second holes 62 of the reflecting sheet 6, further, the insertion sections 41a at the end of the protruding sections 41, 41 are inserted into the holes 74 of the support member 7, a plurality of light emitting diode boards 2 can be simultaneously held on the support member 7, and the reflecting sheet 6 can be pressed against the one surfaces 2a of the light emitting diode boards 2. Moreover, the attachment sections 44 of the board holder 4 are inserted in the attachment holes 71 of the support member 7 from the insertion holes 64 to be latched, the light emitting diode boards 2 and the reflecting sheet 6 can be secured to the support member 7 by the board holder 4, and the reflecting sheet 6 can be prevented from rising from the light emitting diode boards 2.

Figure 9:
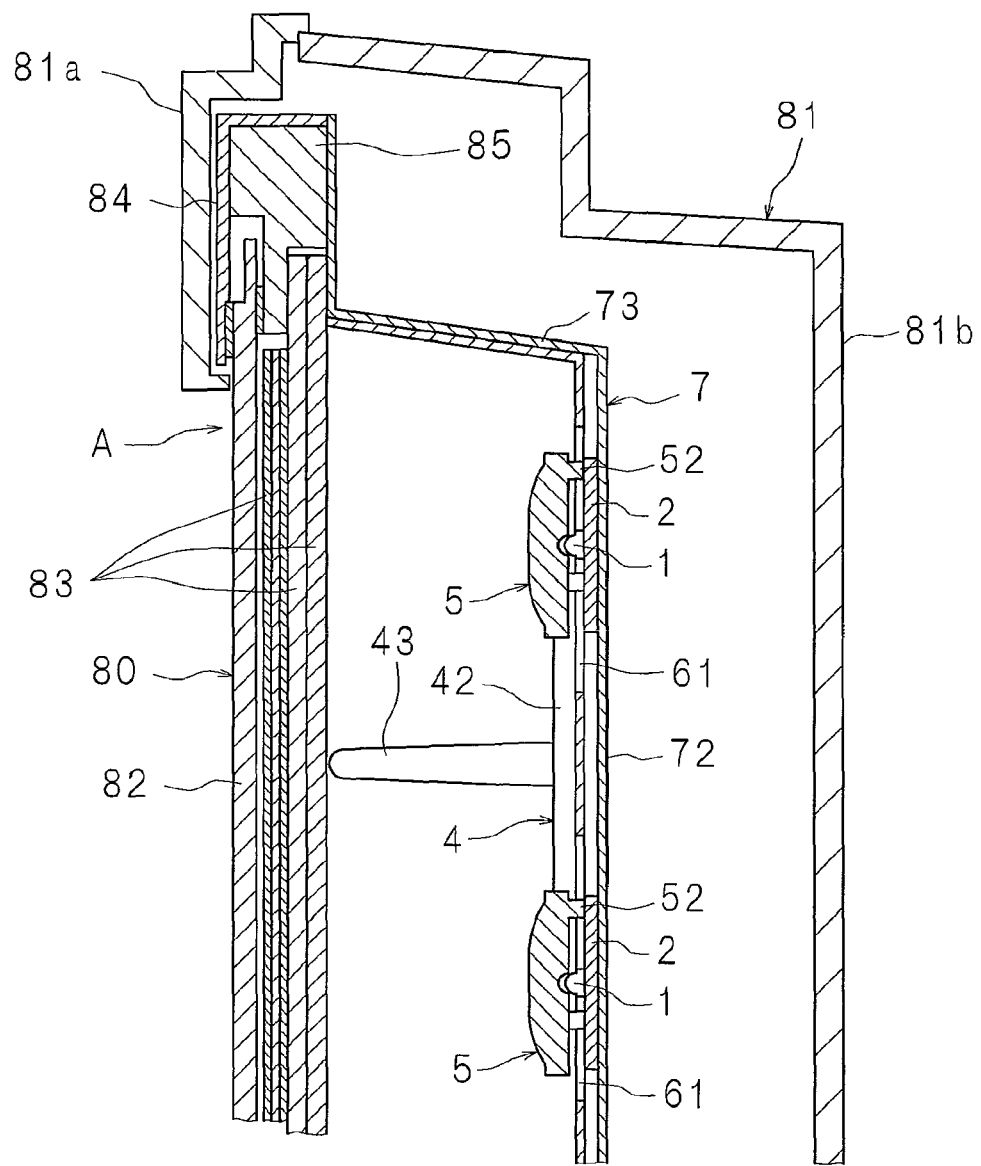
FIG. 9 is a cross-sectional view showing the structure of a display apparatus having the electronic device according to the present invention.

FIG. 9 is a cross-sectional view showing the structure of a display apparatus having the electronic device according to the present invention. This display apparatus has: a display section 80 having on the front side a display screen displaying a television image; an electronic device A disposed on the back side of the display section 80; and a cabinet 81 that covers the peripheral part of the display section 80 and the back side of the electronic device A.

The display section 80 has a display panel 82 having the display screen and an optical sheet 83 disposed on the back side of the display panel 82. The peripheral part of the display panel 82 is held by being sandwiched between a front holder frame 84 and a back holder frame 85 to form a panel module, and the back holder frame 85 is attached to the peripheral part of the support member 7.

The optical sheet 83 is a lamination of a comparatively thick diffuser panel that diffuses the light emitted from the light emitting diodes 1 as light sources and a comparatively thin synthetic resin sheet such as a reflective polarization plate, a prism sheet or a diffusing sheet.

The support member 7 has the plate section 72 and the frame section 73 ranging along the edge of the plate section 72, and the peripheral part of the diffuser plate is supported by the frame section 73.

The board holder 4 attached to the inside of the support member 7 faces in a position facing a central side portion of the optical sheet 83, at a slight distance of an extent that the end of the columnar section 43 is in contact with one surface of the optical sheet 83, and a bend of the optical sheet 83 is limited to keep the distance between the optical sheet 83 and the light emitting diodes 1 uniform.

The cabinet 81 has a cabinet front member 81a that covers the front side of the peripheral part of the display section 80 and a bowl-like cabinet back member 81b that covers the peripheral part of the electronic device A and the back side, and is attached to the frame section 73 of the support member 7 by male screws.

Second Embodiment

This electronic device is structured so that, as shown in FIGS. 6 and 7, the connecting section 42 of the board holder 4 covers the connectors 3.

The board holder 4 is formed of a synthetic resin such as polycarbonate that is excellent in light reflectivity.

The coupling section 42 is formed in a length corresponding to the distance between the light emitting diode boards 2 in the outermost two rows and in a width wider than the connectors 3, faces the other surfaces of a plurality of connectors 3 connecting the adjacent light emitting diode boards 2 in a plurality of rows, and covers the connectors 3.

Since the connectors 3 normally are not white enough to have high reflectivity, if the connectors 3 are exposed, this causes brightness nonuniformity; however, in this electronic device, a plurality of connectors 3 connecting the adjacent light emitting diode boards 2 in a plurality of rows can be covered with the coupling section 42 that is excellent in light reflectivity, and brightness nonuniformity can be reduced.

Since other structures and workings are similar to those of the first embodiment, like parts are denoted by like reference numerals, and detailed descriptions thereof and descriptions of workings and effects are omitted.

Third Embodiment

Figure 10:
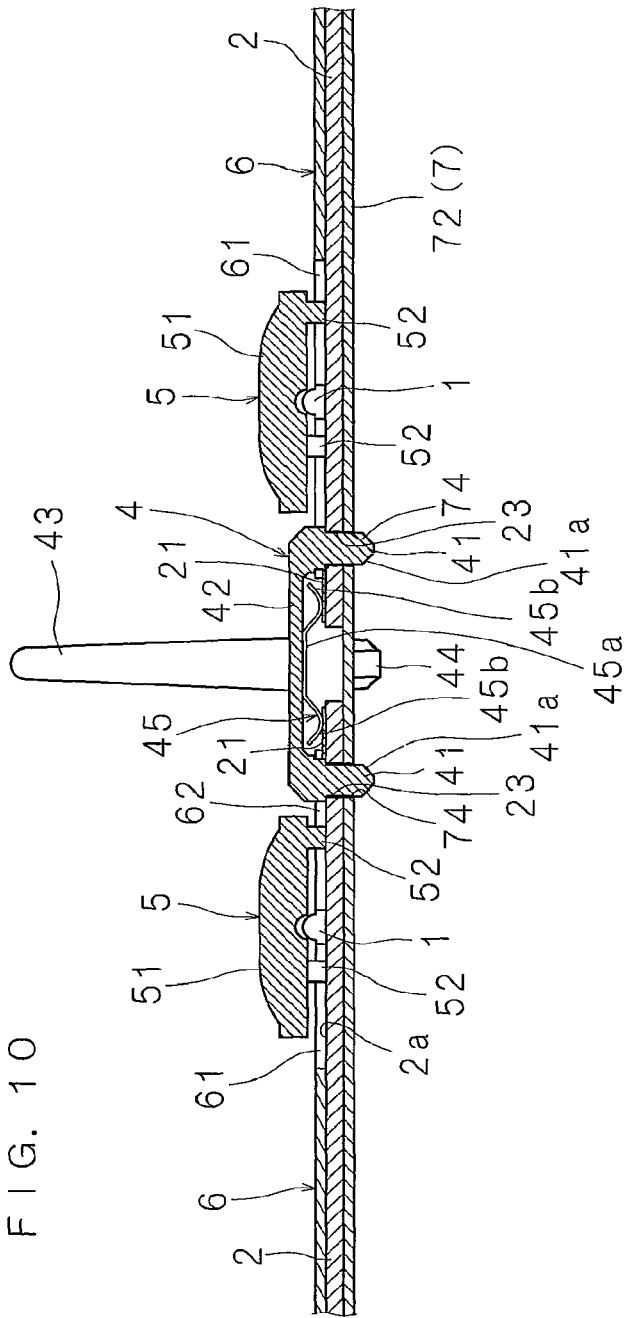
FIG. 10 is an enlarged cross-sectional view showing another structure of the relevant part of the electronic device according to the present invention.

FIG. 10 is an enlarged cross-sectional view showing another structure of the relevant part of the electronic device. This electronic device is structured so that connectors 45 connected to the connecting sections 21, 21 of the adjacent light emitting diode boards 2, 2 are provided between the protruding sections 41, 41 of the coupling section 42 of the board holder 4 such that the connecting sections 21, 21 of the adjacent light emitting diode boards 2, 2 can be connected by the board holder 4.

The connectors 45 is formed of a conductive plate having: a fixed section 45a fixed to the coupling section 42 by fixing means such as an adhesive agent, coupling of concave and convex portions or riveting; and curved connecting sections 45b, 45b ranging on both ends of the fixed section 45a. The connectors 45 is structured so that when the protruding sections 41, 41 are inserted in the holes 23, 23, the connecting sections 45b, 45b are connected to the connecting sections 21, 21 of the light emitting diode boards 2, 2.

In this electronic device, it is not particularly necessary to operate the connectors 45, and the connecting sections 21, 21 of the adjacent light emitting diode boards 2, 2 can be connected together by the work to hold the relative positions of the light emitting diode boards 2 by the board holder 4. Consequently, the connectors 3 can be covered with the coupling section 42 constituting the board holder 4.

Since other structures and workings are similar to those of the first embodiment, like parts are denoted by like reference numerals, and detailed descriptions thereof and descriptions of workings and effects are omitted.

Fourth Embodiment

Figure 11:
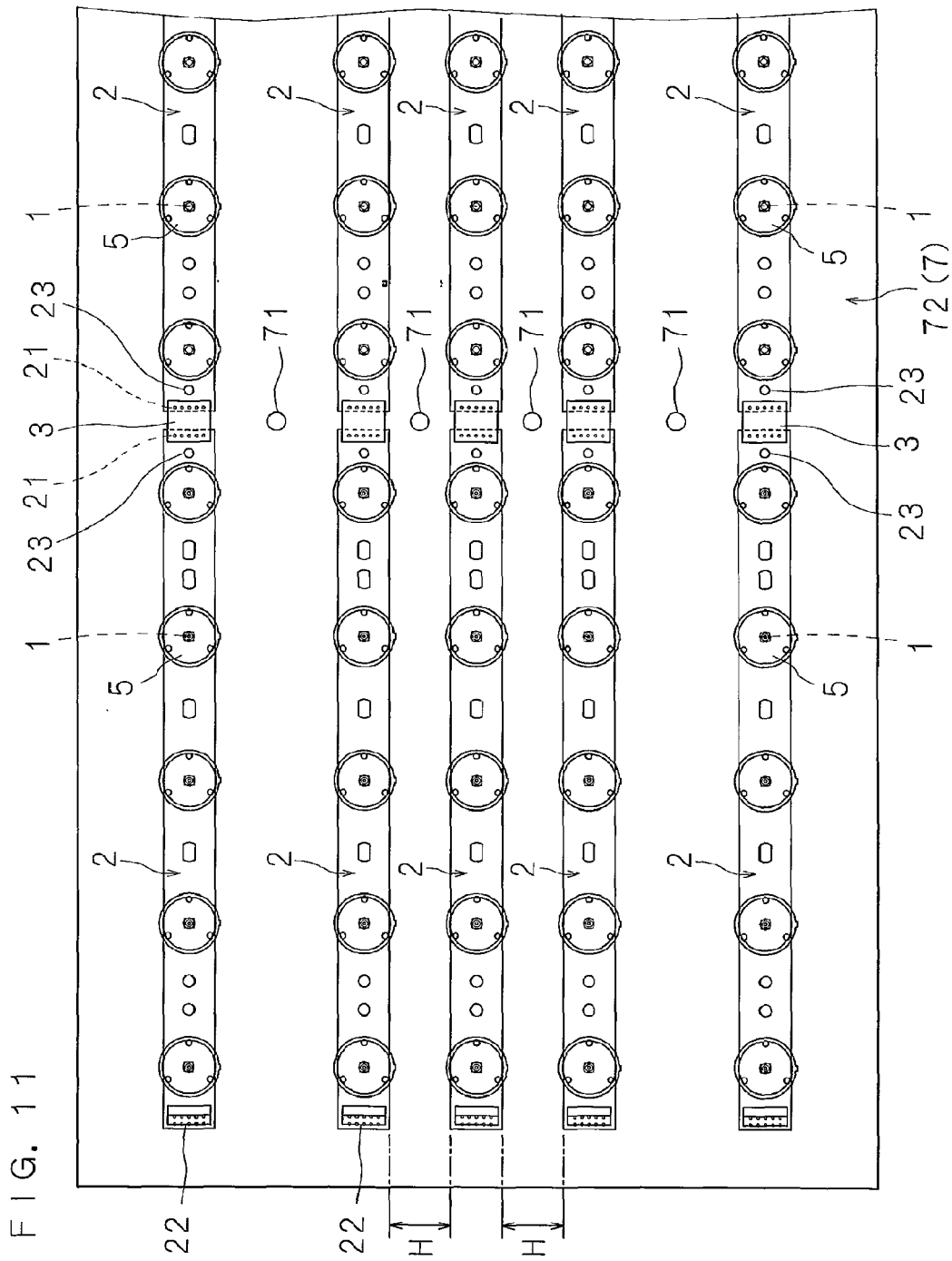
FIG. 11 is an enlarged plan view showing another structure of the relevant part of the electronic device according to the present invention.

FIG. 11 is an enlarged plan view showing another structure of the relevant part of the electronic device. In this electronic device, the distances H between the adjacent rows of the light emitting diode boards 2 disposed in a plurality of rows are varied, in other words, the parallel disposition pitches between the rows of the light emitting diode boards 2 are varied.

In FIG. 11, the intra-row distances on the central side are short, whereas the intra-row distances on both end sides are long. In this case, the board holder 4 and the reflecting sheet 6 are formed in accordance with the distances H between the rows of the light emitting diode boards 2.

Since other structures and workings are similar to those of the first embodiment, like parts are denoted by like reference numerals, and detailed descriptions thereof and descriptions of workings and effects are omitted.

Fifth Embodiment

Figure 12:
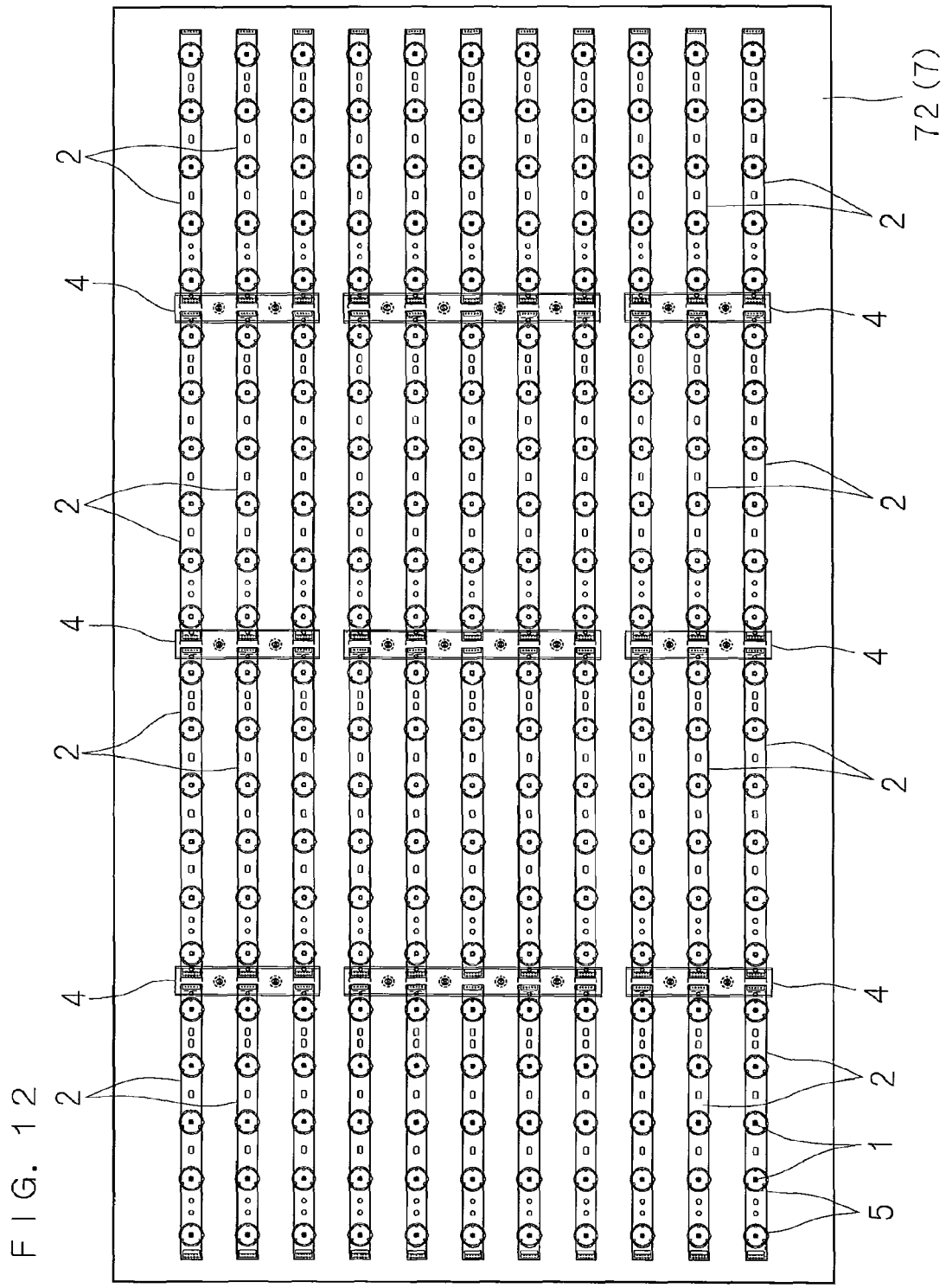
FIG. 12 is a plan view showing another structure of the relevant part of the electronic device according to the present invention.

FIG. 12 is a plan view showing another structure of the relevant part of the electronic device. In this electronic device, the numbers of light emitting diodes 1 mounted on the light emitting diode boards 2 disposed in parallel in the row direction are varied among positions in the row direction.

In FIG. 12, four light emitting diode boards 2 are disposed in parallel in the row direction, the numbers of light emitting diodes 1 on one side and on the other side in the row direction are five, and the numbers of light emitting diodes 1 on the central side in the row direction are six. In this case, the through holes 61 are formed in the reflecting sheet 6 in accordance with the number of mounted light emitting diodes 1.

In this electronic device, the light emitting diode boards 2 having different numbers of light emitting diodes 1 can be combined in accordance with the size of the display screen of the display apparatus, the basic shapes of the light emitting diode boards 2, the board holder 4 and the reflecting sheet 6 can be made the same, the assembly workability, and the productivity of parts such as the board holder 4 can be improved, and cost can be further reduced.

Since other structures and workings are similar to those of the first embodiment, like parts are denoted by like reference numerals, and detailed descriptions thereof and descriptions of workings and effects are omitted.

Sixth Embodiment

FIG. 13 is a schematic view showing another relationship between the light emitting diode boards 2 and the board holder 4. In this electronic device, the light emitting diode boards 2 disposed in parallel in the row direction are arranged in a plurality of rows, and four adjacent light emitting diode boards 2 are held on the support member 7 by one board holder 4.

The light emitting diode boards 2 each have a rectangular shape where the light emitting diodes 1 are mounted so as to be separated in the longitudinal direction and in the width direction. The hole 23 is provided in one angular part of each of the light emitting diode boards 2, and a plurality of holes 74 corresponding to the holes 23 are provided in the support member 7.

On the board holder 4, two protruding sections 41 facing so as to be separated are provided in two rows.

In this electronic device, the two adjacent light emitting diode boards 2, 2 in one row and the two light emitting diode boards 2, 2 in the adjacent row can be simultaneously held on the support member 7, and the assembly workability can be further improved.

Since other structures and workings are similar to those of the first to fifth embodiments, like parts are denoted by like reference numerals, and detailed descriptions thereof and descriptions of workings and effects are omitted.

Seventh Embodiment

Figure 14:
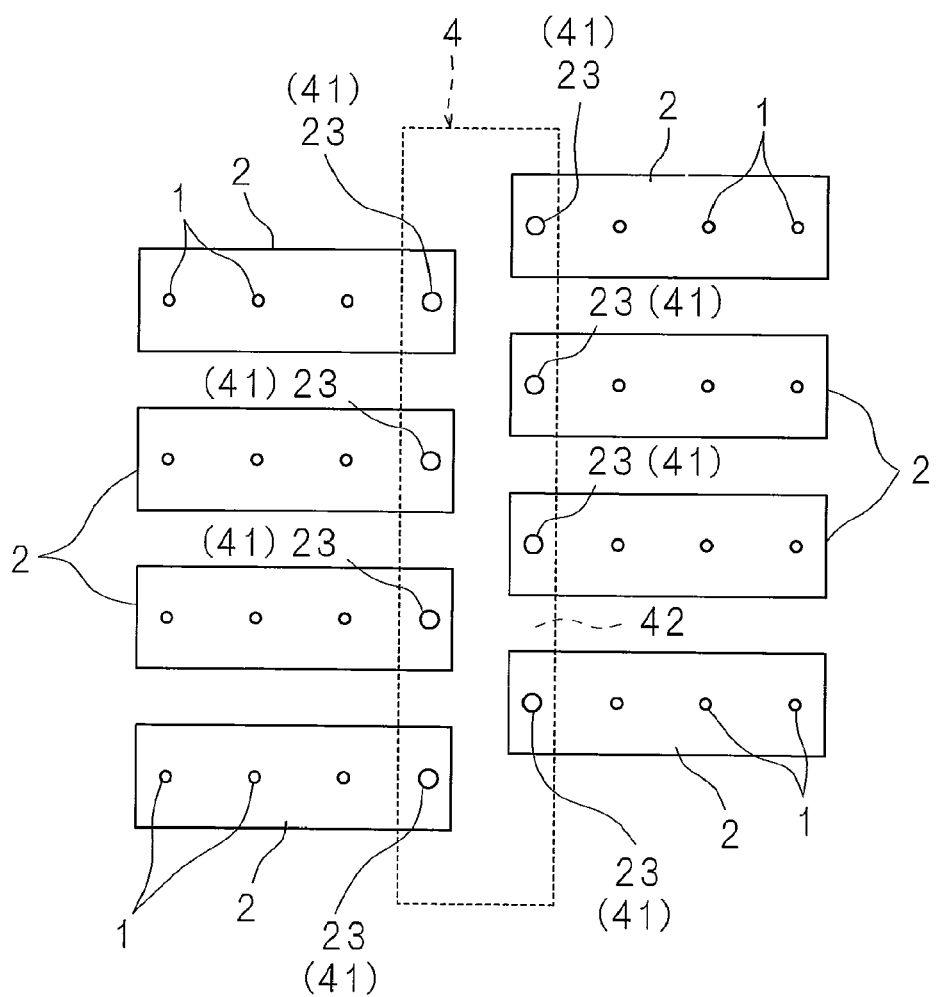
FIG. 14 is a schematic view showing another relationship between the light emitting diode boards and the board holder of the electronic device according to the present invention.

FIG. 14 is a schematic view showing another relationship between the light emitting diode boards 2 and the board holder 4. In this electronic device, the light emitting diode boards 2 disposed in parallel in the row direction are arranged on the support member 7 in a plurality of rows so as to be alternately biased in a direction orthogonally intersecting the row direction into a staggered pattern, and the adjacent light emitting diode boards 2 in a plurality of rows are held on the support member 7 by the board holder 4.

The light emitting diode boards 2 have a strip shape, the holes 23 are provided at one end portions in the longitudinal direction, and a plurality of holes 74 corresponding to the holes 23 are disposed on the support member 7 in a staggered pattern.

The board holder 4 has a strip shape of a length corresponding to the distance between the two light emitting diode boards 2 in the outermost rows, and a plurality of protruding sections 41 corresponding to the light emitting diode boards 2 adjacent in the row direction are arranged in a staggered pattern so as to be separated in the width direction.

With this electronic device, a plurality of light emitting diode boards 2 disposed in a staggered pattern can be simultaneously held on the support member 7, and the assembly workability can be further improved.

Since other structures and workings are similar to those of the first to fifth embodiments, like parts are denoted by like reference numerals, and detailed descriptions thereof and descriptions of workings and effects are omitted.

Eighth Embodiment

Figure 15:
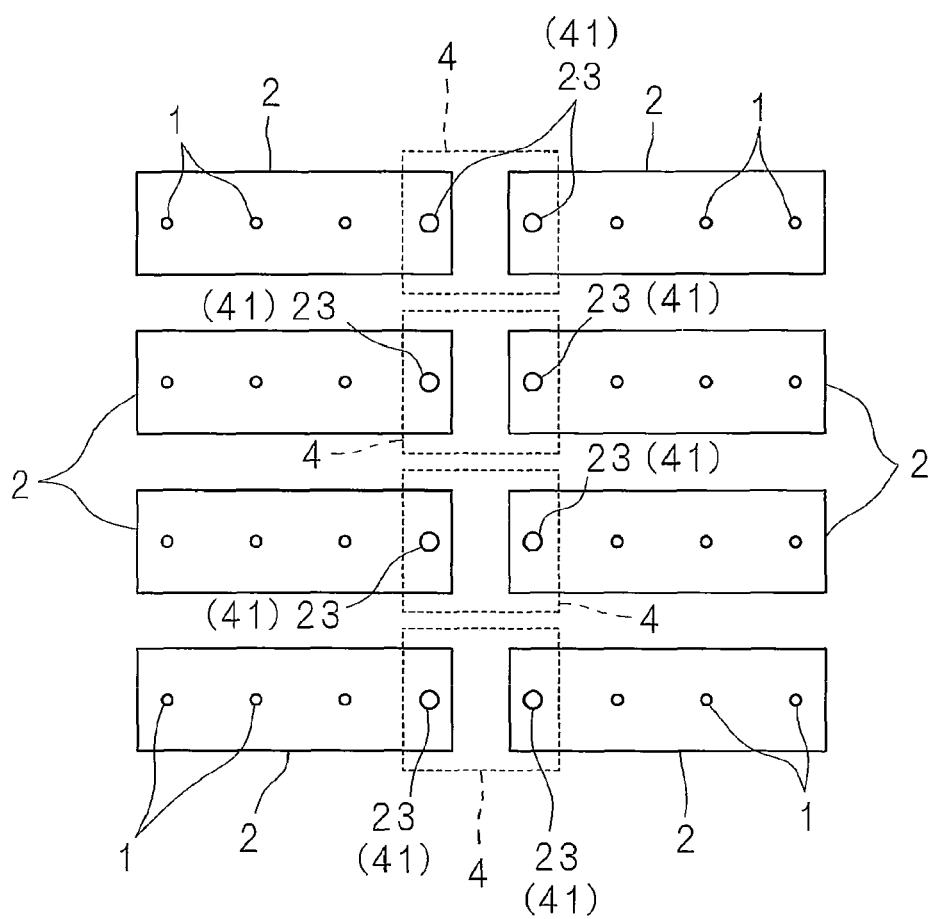
FIG. 15 is a schematic view showing another relationship between the light emitting diode boards and the board holder of the electronic device according to the present invention.

FIG. 15 is a schematic view showing another relationship between the light emitting diode boards 2 and the board holder 4. In this electronic device, the light emitting diode boards 2 disposed in parallel in the row direction are arranged in a plurality of rows on the support member 7, and the light emitting diode boards 2, 2 adjacent in positions in the row direction are held on the support member 7 by the board holder 4.

The light emitting diode boards 2 are formed in a strip shape, the holes 23 are provided at one end portions in the longitudinal direction, and a plurality of holes 74 corresponding to the holes 23 are provided in the support member 7.

On the board holder 4, two protruding sections 41, 41 are disposed in parallel so as to be separated from each other.

In this electronic device, the light emitting diode boards 2, 2 adjacent in positions in the row direction can be simultaneously held on the support member 7, and the assembly workability can be further improved.

Since other structures and workings are similar to those of the first to fifth embodiments, like parts are denoted by like reference numerals, and detailed descriptions thereof and descriptions of workings and effects are omitted.

Ninth Embodiment

Figure 16:
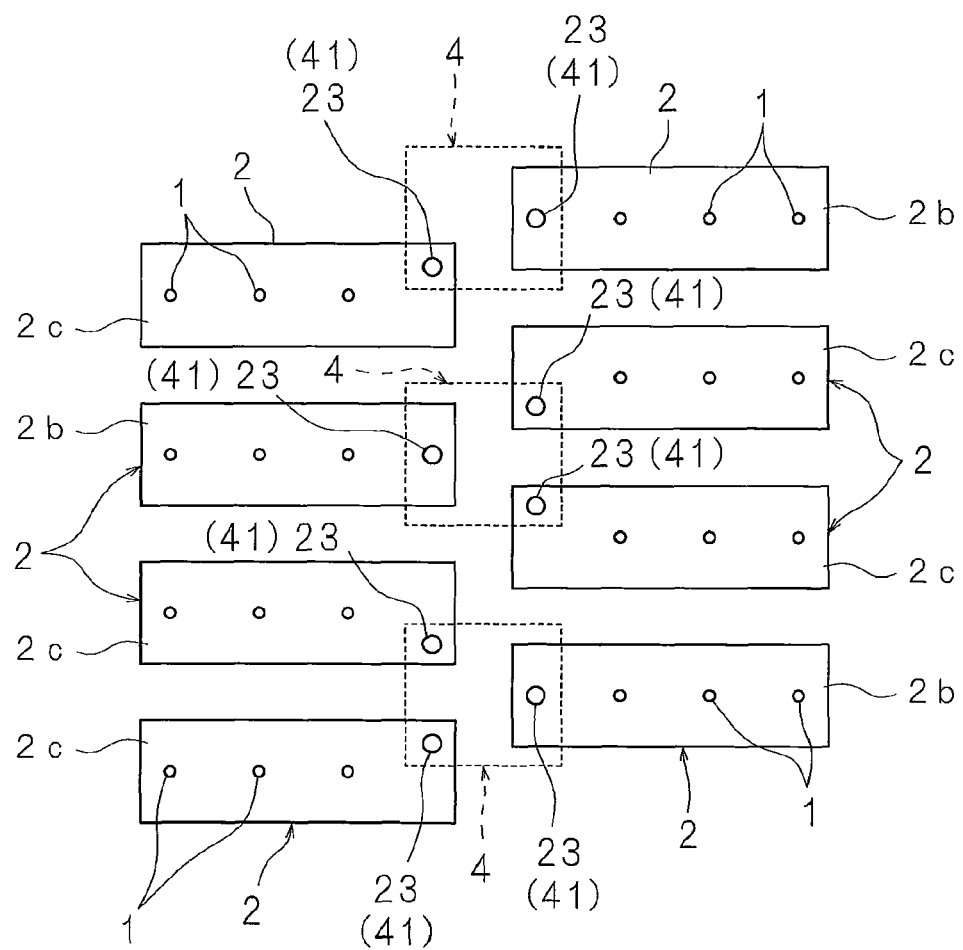
FIG. 16 is a schematic view showing another relationship between the light emitting diode boards and the board holder of the electronic device according to the present invention.

FIG. 16 is a schematic view showing another relationship between the light emitting diode boards 2 and the board holder 4. In this electronic device, the light emitting diode boards 2 disposed in parallel in the row direction are arranged on the support member 7 in a plurality of rows so as to be alternately biased in a direction orthogonally intersecting the row direction into a staggered pattern, and the three light emitting diode boards 2, 2, 2 adjacent to one another are held on the support member 7 by one board holder 4.

The light emitting diode boards 2 are formed in a strip shape, there are first light emitting diode boards 2b each having the hole 23 at one end portion in the longitudinal direction and second light emitting diode boards 2c each having the hole 23 in an angular part at one end portion in the longitudinal direction, the first and second light emitting diodes 2b and 2c are arranged in a staggered pattern, and a plurality of holes 74 corresponding to the holes 23 are arranged in a staggered pattern on the support member 7.

The board holder 4 is provided with three protruding sections 41 corresponding to the holes 23 of the three adjacent light emitting diode boards 2b, 2c, 2c.

In this electronic device, the three light emitting diode boards 2b, 2c, 2c arranged in a staggered pattern can be simultaneously held on the support member 7, and the assembly workability can be further improved.

Since other structures and workings are similar to those of the first to fifth embodiments, like parts are denoted by like reference numerals, and detailed descriptions thereof and descriptions of workings and effects are omitted.

Tenth Embodiment

Figure 17:
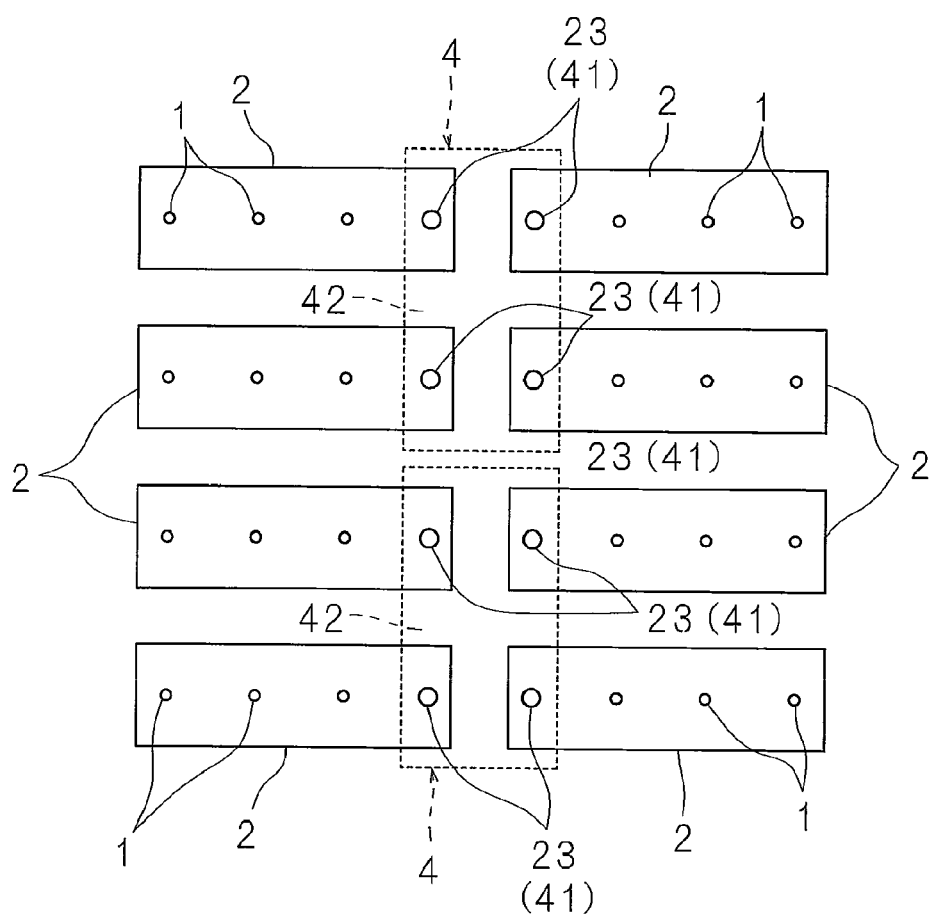
FIG. 17 is a schematic view showing another relationship between the light emitting diode boards and the board holder of the electronic device according to the present invention.

FIG. 17 is a schematic view showing another relationship between the light emitting diode boards 2 and the board holder 4. In this electronic device, the light emitting diode boards 2 disposed in parallel in the row direction are arranged in a plurality of rows, and the two adjacent light emitting diode boards 2, 2 in one row and the two light emitting diode boards 2, 2 in the adjacent row are simultaneously held on the support member 7 by one board holder 4.

The light emitting diode boards 2 are formed in a strip shape, the holes 23 are provided at one end portions in the longitudinal direction, and a plurality of holes 74 corresponding to the holes 23 are provided in the support member 7.

On the board holder 4, the two protruding sections 41 facing so as to be separated are provided in two rows.

In this electronic device, the two adjacent light emitting diode boards 2, 2 in one row and the two light emitting diode boards 2, 2 in the adjacent row can be simultaneously held on the support member 7, and the assembly workability can be further improved.

Since other structures and workings are similar to those of the first to fifth embodiments, like parts are denoted by like reference numerals, and detailed descriptions thereof and descriptions of workings and effects are omitted.

Eleventh Embodiment

Figure 18:
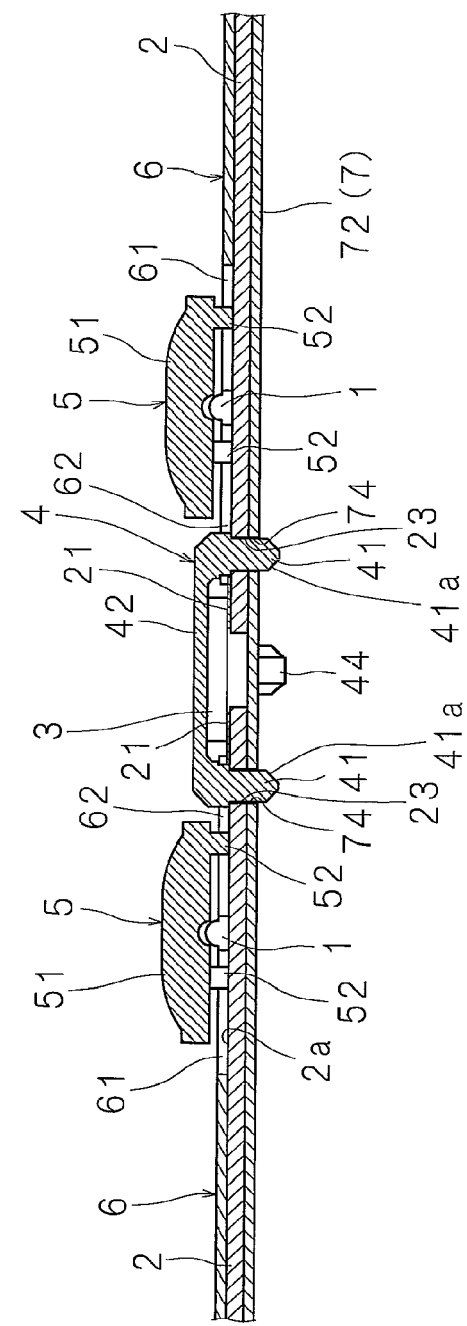
FIG. 18 is a cross-sectional view showing another structure of the relevant part of the electronic device according to the present invention.

FIG. 18 is a cross-sectional view showing another structure of the relevant part of the electronic device according to the present invention. In this electronic device, the columnar section 43 of the board holder 4 is eliminated.

In this electronic device, a sheet receiver that is in contact with the sheet surface of the optical sheet 83 to thereby limit a bend of the optical sheet 83 is separately provided as required, and attachment holes for attaching the sheet receiver are provided in the support member 7 or the light emitting diode boards 2.

Since other structures and workings are similar to those of the first to fifth embodiments, like parts are denoted by like reference numerals, and detailed descriptions thereof and descriptions of workings and effects are omitted.

The above-described second to eleventh embodiments may be combined with any of the first to eleventh embodiments.

Moreover, while in the above-described embodiments, the light emitting diode boards 2 having the same length are disposed in parallel so as to be separated in the width direction and the parts where the light emitting diode boards 2 in each row adjoin each other are aligned in the width direction of the light emitting diode boards 2, additionally, a structure may be adopted such that the light emitting diode boards 2 having different lengths are disposed in parallel so as to be separated in the width direction and the parts where the light emitting diode boards 2 adjoin each other in each row are varied, for example, in a staggered pattern or linearly biased in a direction intersecting the longitudinal direction of the light emitting diode boards 2, and the structure of combination of the light emitting diode boards 2 is not specifically limited. In this case, the board holder 4 and the reflecting sheet 6 are formed in accordance with the structure of combination of the light emitting diode boards 2.

Moreover, while in the above-described embodiments, the board holder 4 presses the reflecting sheet 6 toward the light emitting diode boards 2, additionally, the board holder 4 may hold the light emitting diode boards 2 without pressing the reflecting sheet 6.

As this description may be embodied in several forms without departing from the spirit of essential characteristics thereof, the present embodiments are therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A board holder for holding, on a support member for supporting a plurality of circuit boards disposed in parallel, the circuit boards, comprising:
a plurality of protruding sections to be inserted in holes formed in adjacent circuit boards of the plurality of circuit boards and the support member; and
a coupling section coupling the protruding sections,
wherein the coupling section has an attachment section attached to the support member.

2. The board holder according to claim 1, wherein the protruding sections are arranged in a plurality of rows.

3. The board holder according to claim 1, wherein
the coupling section has a columnar section having an end contacting with a sheet surface of an optical sheet disposed facing to the circuit boards with a space therebetween, thereby limiting a bend of the optical sheet.

4. The board holder according to claim 1, comprising a connector provided between the protruding sections of the coupling section.

5. An electronic device characterized by comprising:
a plurality of circuit boards disposed in parallel and having a light emitting diode mounted thereon; and
the board holder according to claim 1.

6. The electronic device according to claim 5, wherein the circuit boards are arranged in a plurality of rows.

7. The electronic device according to claim 5, wherein
on one surface of each of the circuit boards, a circuit section and the light emitting diode are disposed, and
a connecting section for connecting the adjacent circuit boards together by the connector is provided on the one surface.

8. The electronic device according to claim 7, wherein the connector is provided on the coupling section.

9. The electronic device according to claim 5, comprising a support member for supporting the circuit boards, wherein
the support member and the circuit boards are provided with holes in which the protruding sections are inserted.

10. The electronic device according to claim 5, comprising a reflecting sheet that has: a through hole in which the light emitting diode is disposed; and second holes in which the protruding sections are inserted, and faces the circuit boards so as to reflect light emitted by the light emitting diode.

11. The electronic device according to claim 6, wherein adjacent rows of the circuit boards are separated by different distances.

12. The electronic device according to claim 5, wherein the numbers of light emitting diodes mounted on each of the circuit boards disposed in parallel are different.

13. A display apparatus characterized by comprising:
a display section having a display screen on one side; and
the electronic device according to claim 5 disposed on the other side of the display section.

* * * * *